(12) United States Patent  
Bito et al.

(10) Patent No.: US 12,317,638 B2
(45) Date of Patent: May 27, 2025

(54) SENSOR PACKAGES WITH WAVELENGTH-SPECIFIC LIGHT FILTERS

(71) Applicant: TEXAS INSTRUMENTS INCORPORATED, Dallas, TX (US)

(72) Inventors: Jo Bito, Dallas, TX (US); Benjamin Stassen Cook, Los Gatos, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/161,581

(22) Filed: Jan. 28, 2021

(65) Prior Publication Data

US 2022/0238733 A1 Jul. 28, 2022

(51) Int. Cl.
*H01L 23/31* (2006.01)
*H01L 23/00* (2006.01)
*H01L 23/29* (2006.01)
*H10F 77/30* (2025.01)
*H10F 77/50* (2025.01)

(52) U.S. Cl.
CPC ......... *H10F 77/331* (2025.01); *H01L 23/293* (2013.01); *H01L 23/31* (2013.01); *H01L 24/14* (2013.01); *H10F 77/50* (2025.01)

(58) Field of Classification Search
CPC . H01L 31/02162; H01L 23/293; H01L 23/31; H01L 24/14; H01L 31/0203
See application file for complete search history.

(56) References Cited

U.S. PATENT DOCUMENTS

| | | | | |
|---|---|---|---|---|
| 6,566,151 B2* | 5/2003 | Yeh | .................... | H01L 27/14632 438/70 |
| 6,630,722 B1* | 10/2003 | Aoki | ................. | H01L 31/02164 257/E31.127 |
| 7,264,976 B2* | 9/2007 | Deng | ............... | B29D 11/00278 257/E33.068 |
| 8,669,632 B2* | 3/2014 | Nakamura | ........ | H01L 27/14627 257/E31.093 |
| 8,815,630 B1* | 8/2014 | JangJian | ........... | H01L 27/14685 257/E31.127 |
| 9,136,292 B2* | 9/2015 | Coffy | .................... | H01L 31/173 |
| 9,373,732 B2* | 6/2016 | Velichko | ........... | H01L 31/02327 |
| 10,043,924 B1* | 8/2018 | Kaufmann | ............ | H01L 25/167 |
| 10,276,620 B2* | 4/2019 | Chien | ................. | H01L 27/1464 |
| 10,651,225 B2* | 5/2020 | Huang | .............. | H01L 27/14634 |
| 10,879,296 B2* | 12/2020 | Cai | .................. | H01L 27/14629 |
| 10,937,821 B2* | 3/2021 | Jung | ................. | H01L 27/14623 |
| 11,574,943 B2* | 2/2023 | Cho | .................. | H01L 27/14621 |
| 11,594,563 B2* | 2/2023 | Yamamoto | ........ | H01L 27/14645 |

(Continued)

*Primary Examiner* — Eugene Lee
(74) *Attorney, Agent, or Firm* — Frank D. Cimino

(57) ABSTRACT

In examples, a sensor package comprises a die pad and a semiconductor die on the die pad. The semiconductor die has an active surface. The sensor package includes a light sensor on the active surface of the semiconductor die. The sensor package includes a mold compound covering the die pad, the semiconductor die, and a portion of the active surface. The sensor package includes a light filter covering the light sensor and abutting the mold compound. The light filter includes a combination of silicone, metal particles, and an organic dye. The combination is configured to reject light having a wavelength in a target wavelength range. The light filter has a thickness of at least 0.5 millimeters.

25 Claims, 9 Drawing Sheets

(56) References Cited

U.S. PATENT DOCUMENTS

| | | | |
|---|---|---|---|
| 2006/0275944 A1* | 12/2006 | Hyun | H01L 27/14685 438/70 |
| 2006/0292731 A1* | 12/2006 | Kim | H01L 27/14627 438/57 |
| 2007/0126914 A1* | 6/2007 | Komatsu | H01L 27/14618 348/340 |
| 2007/0145439 A1* | 6/2007 | Han | H01L 27/14687 257/291 |
| 2007/0148846 A1* | 6/2007 | Hyun | H01L 27/14689 257/E27.134 |
| 2009/0142709 A1* | 6/2009 | Hiatt | H01L 27/14621 430/321 |
| 2009/0243015 A1* | 10/2009 | Yoneda | H01L 31/0203 257/434 |
| 2009/0295953 A1* | 12/2009 | Nozaki | H01L 27/14636 348/294 |
| 2009/0302407 A1* | 12/2009 | Gidon | G02B 5/288 257/E31.127 |
| 2009/0315131 A1* | 12/2009 | Hung | H01L 27/14632 257/E31.127 |
| 2010/0245637 A1* | 9/2010 | Itonaga | H01L 27/14629 438/69 |
| 2013/0119236 A1* | 5/2013 | Lenchenkov | H01L 27/14621 257/432 |
| 2014/0225212 A1* | 8/2014 | Kaschner | H01L 25/042 257/443 |
| 2014/0239361 A1* | 8/2014 | Ma | H01L 27/14629 257/292 |
| 2017/0256658 A1* | 9/2017 | Tsukagoshi | H01L 31/02002 |
| 2019/0004207 A1* | 1/2019 | Wong | H01L 31/167 |
| 2019/0018174 A1* | 1/2019 | Ito | G02B 5/003 |
| 2019/0074399 A1* | 3/2019 | Masuda | H04N 23/56 |
| 2019/0229141 A1* | 7/2019 | Kim | H01L 27/14621 |
| 2019/0252440 A1* | 8/2019 | Chien | H01L 27/14629 |
| 2020/0098808 A1* | 3/2020 | Wu | H01L 27/14625 |
| 2020/0266225 A1* | 8/2020 | Cheng | H01L 27/14621 |
| 2021/0007604 A1* | 1/2021 | Esser | A61B 5/681 |
| 2021/0011342 A1* | 1/2021 | Chen | H01L 33/44 |
| 2021/0382197 A1* | 12/2021 | Wong | G01V 8/12 |
| 2022/0052119 A1* | 2/2022 | Yoon | H10K 59/38 |
| 2023/0027390 A1* | 1/2023 | Cho | H01L 27/14636 |

* cited by examiner

SENSOR PACKAGES WITH WAVELENGTH-SPECIFIC LIGHT FILTERS

BACKGROUND

Electrical circuits are formed on semiconductor dies and subsequently packaged inside mold compounds to protect the circuits from damage due to elements external to the package, such as moisture, heat, and blunt force. To facilitate communication with electronics external to the package, an electrical circuit within the package is electrically coupled to conductive terminals. These conductive terminals are positioned inside the package but are exposed to one or more external surfaces of the package. By coupling the conductive terminals to electronics external to the package, a pathway is formed to exchange electrical signals between the electrical circuit within the package and the electronics external to the package via the conductive terminals.

SUMMARY

In examples, a sensor package comprises a die pad and a semiconductor die on the die pad. The semiconductor die has an active surface. The sensor package includes a light sensor on the active surface of the semiconductor die. The sensor package includes a mold compound covering the die pad, the semiconductor die, the conductive terminal, and a portion of the active surface. The sensor package includes a light filter covering the light sensor and abutting the mold compound. The light filter includes a combination of silicone, metal particles, and an organic dye. The combination is configured to reject light having a wavelength in a target wavelength range. The light filter has a minimum thickness of 0.5 millimeters.

In examples, a method comprises coupling a semiconductor die to a die pad, the semiconductor die having a light sensor. The method includes positioning the die pad and the semiconductor die in a mold chase. The method includes lowering a mold chase member having a dam toward the semiconductor die such that the dam covers the light sensor. The method includes injecting a mold compound into the mold chase to cover the die pad and the semiconductor die with the mold compound, the dam configured to prevent the mold compound from covering the light sensor. The method includes depositing a light filter solution including a combination of silicone, an epoxy including metal particles, and an organic dye onto the light sensor. The combination is configured to reject light having a wavelength in a target wavelength range. The method includes curing the light filter solution to form a light filter.

DETAILED DESCRIPTION

Figure 1A:
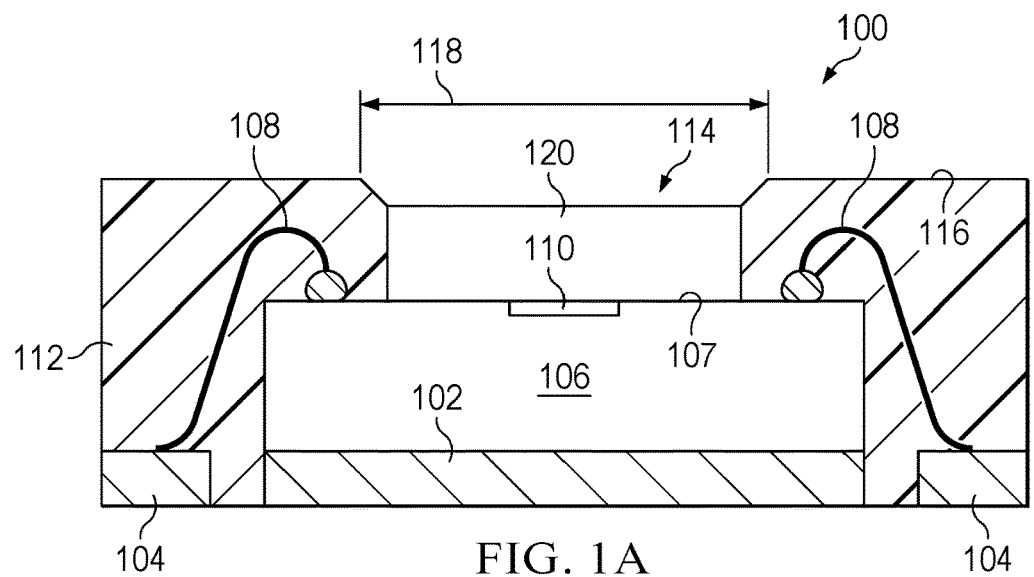
FIGS. 1A, 1B and 1C are profile cross-sectional, top-down, and perspective views, respectively, of a sensor package having a wavelength-specific light filter, in accordance with various examples.

Some packages include sensors that are positioned on or in the semiconductor die. These sensors are configured to sense various properties in the environment, such as light, humidity, temperature, sound, potential of hydrogen (pH), and others. To sense many such properties, the sensor may be exposed to the environment, with the remainder of the package covered by an opaque mold compound. For example, to sense the pH of a liquid, the sensor may come into direct contact with the liquid. However, light sensors are not directly exposed to the environment. Instead, a transparent or translucent material may cover light sensors. This transparent or translucent material permits light to reach the sensor but simultaneously protects the sensor from damage.

In some light sensor applications, it is useful to filter (reject) specific wavelengths of light so such light does not reach the light sensor. For example, in some cases, a transparent mold compound containing a wavelength-specific light rejection dye is used in lieu of an opaque mold compound to cover the semiconductor die, the light sensor, and other package components. While somewhat effective in filtering specific wavelengths of light, such transparent mold compounds are expensive because they entail covering all package components, rather than just the light sensor, with the transparent mold compound. In other cases, a light filter film is used to cover the light sensor. Like the transparent mold compound, this light filter film is configured to reject specific wavelengths of light. Unlike the transparent mold compound, the light filter film does not cover all package components. However, the light filter film is still expensive because of the manner in which it is applied. Specifically, the film is applied in liquid form to a wafer at the wafer stage of the package manufacturing process. The wafer is then spun to produce an even film coating. Portions of the film not covering the light sensor are then removed. This waste results in an inefficient and expensive application process.

This description presents various examples of a sensor package with a wavelength-specific light filter. The sensor package includes an opaque mold compound that covers various components of the sensor package, such as the semiconductor die. The mold compound includes a cavity, and a light sensor formed on or in the semiconductor die is exposed to this cavity. The cavity includes a transparent or translucent light filter covering the light sensor, abutting the opaque mold compound, and having a thickness of at least 0.5 millimeters. The light filter includes a combination of silicone, epoxy, metal particles, and an organic dye. This combination of materials is specifically configured to reject light having a wavelength in a target wavelength range, such as the infrared light wavelength range. The specific wavelengths filtered may be controlled by adjusting the thickness of the light filter and/or the material composition of the light filter. The light filter is deposited as a solution (e.g., using a syringe) into the cavity after the mold compound has been injected and cured, and the light filter solution is then cured. Because the light filter is applied in the area of the light sensor rather than the entire semiconductor die or the entire package, costs are mitigated relative to other solutions.

Figure 1B:
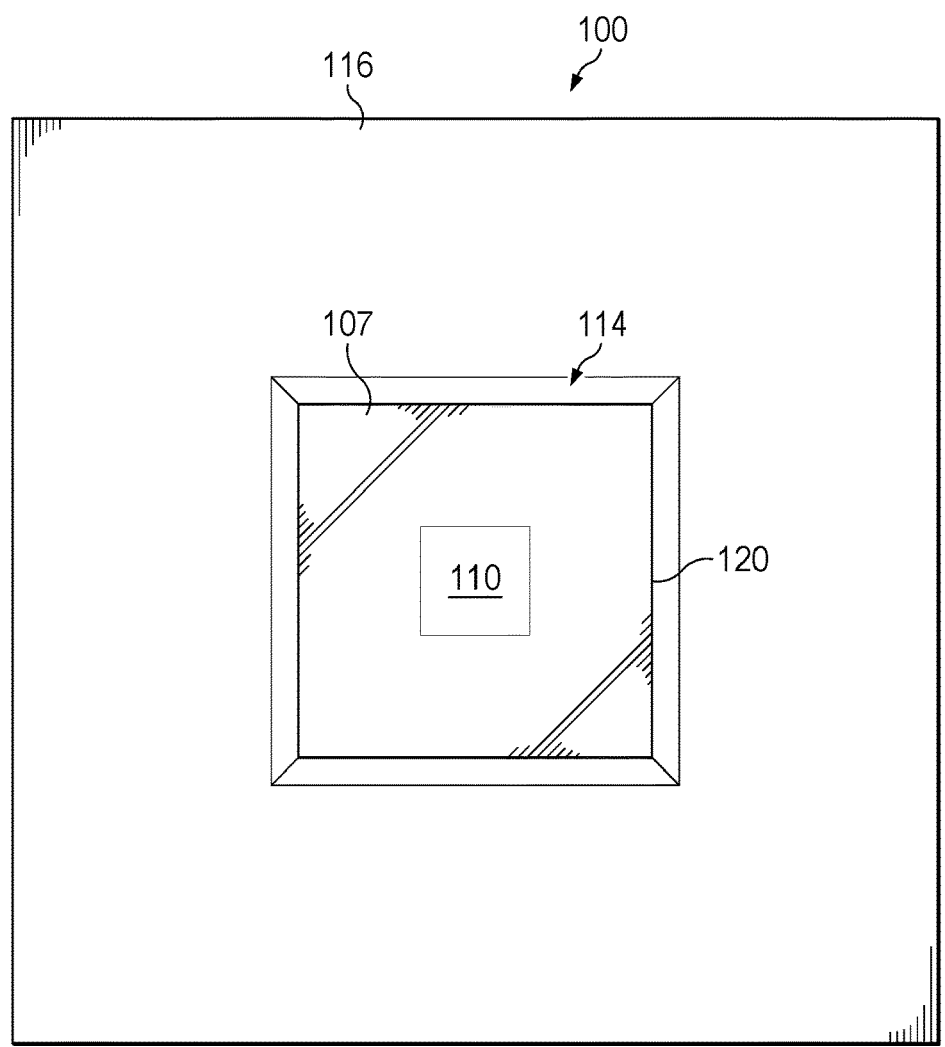
Figure 1C:
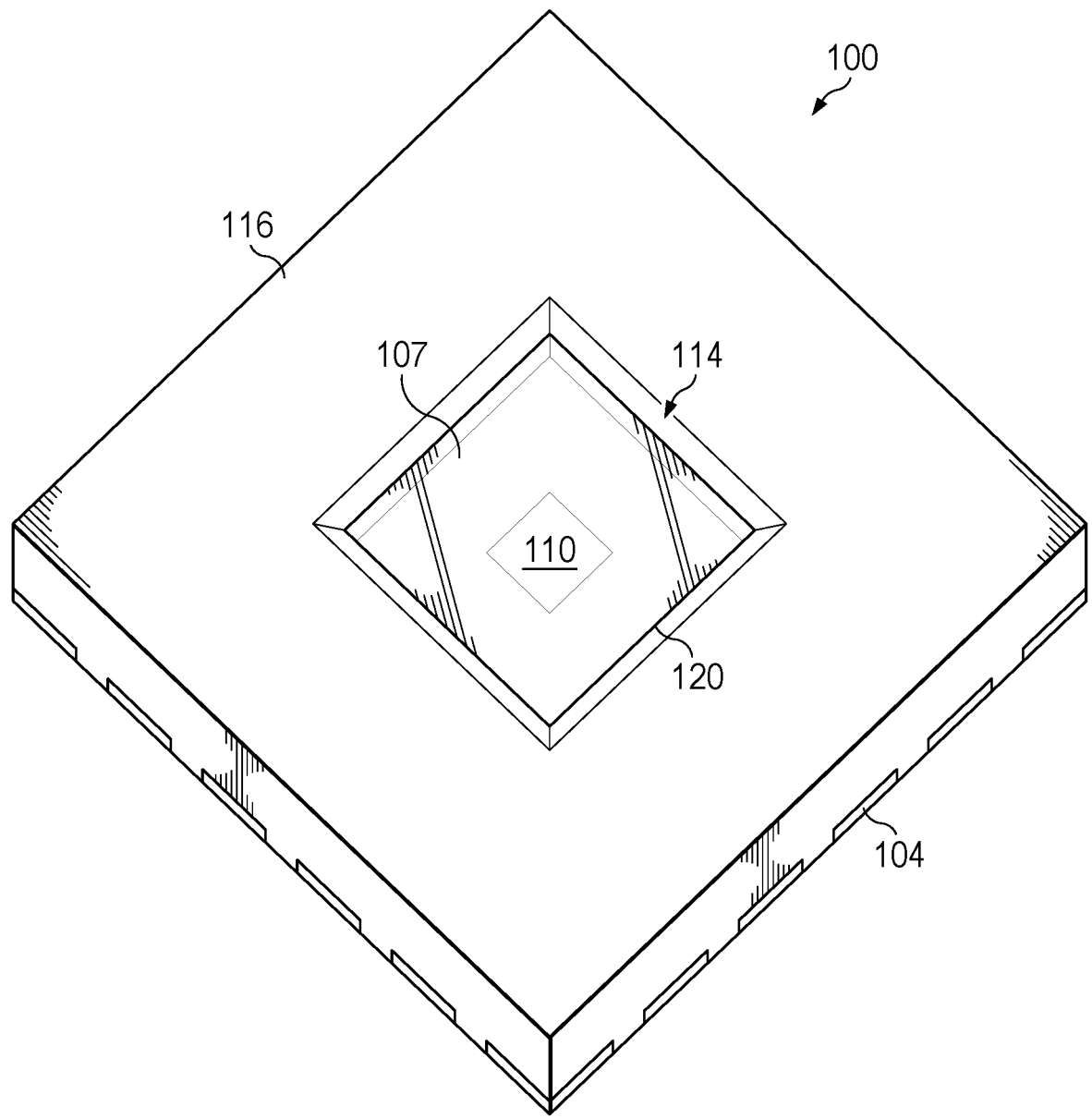

FIGS. 1A, 1B and 1C are profile cross-sectional, top-down, and perspective views, respectively, of a sensor package having a wavelength-specific light filter, in accordance with various examples. Specifically, FIG. 1A is a profile cross-sectional view of an example sensor package 100. FIG. 1A shows the sensor package 100 as a wire bonded quad flat no-lead (QFN) style package, but other types of packages, such as dual in-line packages (DIP), packages with gullwing-style leads, etc., also fall within the scope of this description. The sensor package 100 includes a die pad 102 and conductive terminals 104. The sensor package 100 includes a semiconductor die 106 (e.g., a silicon die) coupled to the die pad 102. The semiconductor die 106 includes an active surface 107 on and/or in which various circuits and/or circuit components may be formed. Bond wires 108 couple to the active surface 107 and to the conductive terminals 104.

The sensor package 100 includes a light sensor 110 on and/or in the active surface 107. The light sensor 110 may be any suitable type of light sensor for a given application. For example, a smartphone containing the sensor package 100 may include a light sensor 110 that is suitable for capturing ambient light that is useful to other circuitry in the smartphone to adjust output settings on a display. An opaque mold compound 112 partially or fully covers the die pad 102, the conductive terminals 104, the semiconductor die 106, the active surface 107, and the bond wires 108. The mold compound 112 includes a cavity 114 that may be partially hollow and partially filled or that may be fully filled, as described below. The dimensions of the cavity 114 may be chosen for a specific application, with wider and/or shallower cavities permitting light from a wider angle of view to reach the light sensor 110 and narrower and/or deeper cavities permitting light from a narrower angle of view to reach the light sensor 110. The depth of the cavity 114 may be measured from a top surface 116 of the mold compound 112 to the active surface 107, and the width of the cavity 114 may be measured as numeral 118 indicates. The light sensor 110 may be exposed to the cavity 114. In examples, the term exposed to means that, other than the light filter 120 (described below), no other components or materials are positioned between the light sensor 110 and the cavity 114.

The sensor package 100 includes a light filter 120. The light filter 120 includes a combination of silicone, an epoxy base material with metal particles, and an organic dye. The specific types, quantities, and/or proportions of silicone, epoxy base, metal particles, and organic dyes used are collectively referred to herein as the material composition of the light filter 120. This material composition may vary and may be selected to achieve specific properties of the light filter 120, such as the physical properties described below, as well as the ability to filter specific target wavelength ranges. Examples of the silicone material include phenyl resin silicone and methyl silicone. Examples of the epoxy base material include biphenyl and bisphenol epoxy. Examples of the metal particles include aluminum oxide and titanium oxide. Examples of the organic dyes include squalilium and phthalocyanine. In examples, the light filter 120 is translucent or transparent.

In some examples, the light filter 120 fills the entire cavity 114, and in other examples, the light filter 120 fills part, but not all, of the cavity 114. In some examples, the light filter 120 has a minimum thickness of 0.5 millimeters. A thinner light filter 120 may not adequately filter light in the target wavelength range, although it is possible to adjust the material composition of a light filter 120 thinner than 0.5 millimeters as described below to increase filtering efficacy. A thickness of 0.5 millimeters is not possible in other solutions using light filter films because the light filter film is applied to a wafer and the wafer is subsequently spun, resulting in a light filter film that is consistently below 0.5 millimeters in thickness. Although various thicknesses may be possible in transparent mold compound solutions, these solutions are costly, as described above. In contrast to these other solutions, the light filter 120 of the sensor package 100 covers only an area in the vicinity of the light sensor 110 (e.g., sufficient to permit adequate light from a target angle of view to reach the light sensor 110) and is deposited into the cavity 114 after the remainder of the sensor package 100 has been assembled, resulting in an inexpensive solution that can reach thicknesses of 2.0 millimeters or more. In some examples, a thickness exceeding 5.0 millimeters may preclude adequate light from reaching the light sensor 110.

In some examples, the material composition of the light filter 120 may be adjusted to produce a light filter 120 having specific properties, some of which may be realized prior to curing, and others which may be realized post-curing. Some of these properties are now described. For example, the light filter 120 may have a viscosity ranging from 1.0 Pascal-seconds to 1.5 Pascal-seconds at 23 degrees Celsius prior to curing. A more viscous solution may produce a light filter 120 with flaws, such as uneven thicknesses in the light filter 120. A less viscous solution may cause patterning and contamination due to the spread of ink. In some examples, the light filter 120 may have a density ranging from 1.1 grams/cm$^3$ to 1.3 grams/cm$^3$. In some examples, the light filter 120 may have a hardness ranging between 80 and 90 on the type D Shore hardness scale, with a hardness less than 80 possibly resulting in cosmetic scratches on the package and possibly causing internal damage to the silicon die, and with a hardness greater than 90 being difficult to realize due to the combination of materials used to form the light filter 120. In some examples, the light filter 120 may have a flexural strength ranging from 50 to 60 Mega Pascals, with a flexural strength below this range possibly resulting in fractures in the package, and a flexural strength above this range being difficult to realize due to the combination of materials used to form the light filter 120. In some examples, the light filter 120 may have a flexural modulus ranging from 1400 to 1500 Mega Pascals, with a flexural modulus below this range possibly resulting in internal damage to the silicon die, and a flexural modulus above this range possibly resulting in fractures to the package responsive to the package being under mechanical stress.

In some examples, the light filter 120 may have a glass transition temperature ranging from 160 to 180 degrees Celsius, with a glass transition temperature lower than this range possibly resulting in deformation under high temperatures, and a glass transition temperature higher than this range being difficult to realize due to the combination of materials used to form the light filter 120. In some examples, if a mismatch in coefficients of thermal expansion exists between the silicon die and other package materials such as the mold compound, cracks may result in high or low temperature conditions. In some examples, the light filter 120 may have a volume resistivity ranging from 80 to 90 tera Ohm-meters, with a volume resistivity below this range possibly resulting in breakdown due to electrostatic discharge, and a volume resistivity above this range being difficult to realize due to the combination of materials used to form the light filter 120. In some examples, the light filter 120 has a moisture permeation ranging from 3.0 to 5.0 grams/m²-days, with a moisture permeation below this range being difficult to realize due to the combination of materials used to form the light filter 120, and a moisture permeation above this range possibly resulting in oxidation and damage to metals inside the package, such as to bond wires.

The material composition of the light filter 120 may be specifically configured to filter light having specific target wavelength ranges. For example, the light filter 120 may be configured to reject some or all infrared light. In some examples, the light filter 120 is configured to reject light in a specific target wavelength range that is a contiguous portion of the light spectrum, and in other examples, the light filter 120 is configured to reject light in a specific target wavelength range that is divided into two or more non-contiguous portions of the light spectrum.

FIG. 1B is a top-down view of the sensor package 100. In examples, the light sensor 110 has a rectangular shape in the horizontal plane. In examples, the cavity 114 has a rectangular shape in the horizontal plane. As FIG. 1B shows, the light filter 120 is transparent, making the light sensor 110 and the active surface 107 visible in this top-down view. FIG. 1C is a perspective view of the sensor package 100.

Figure 2A:
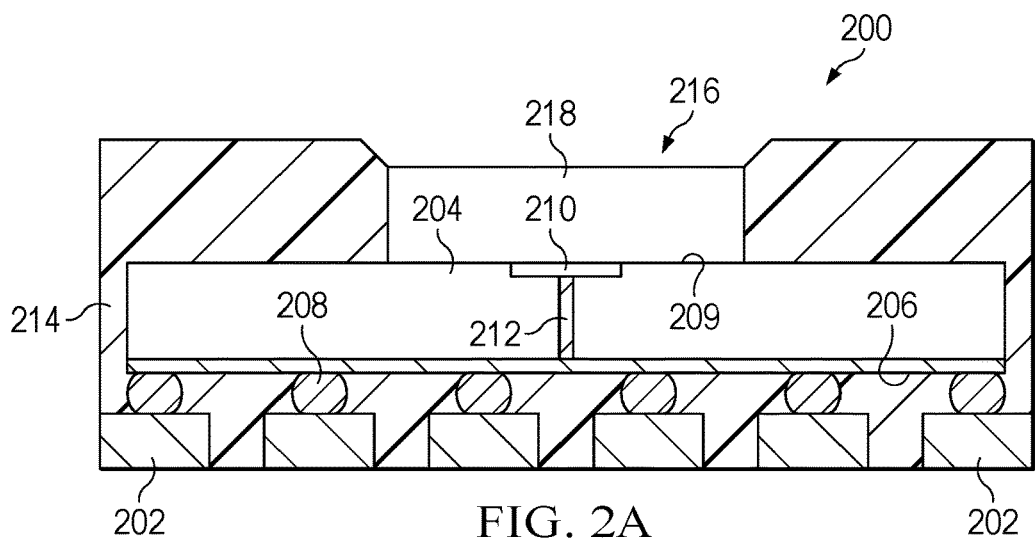
FIGS. 2A, 2B and 2C are profile cross-sectional, top-down, and perspective views, respectively, of a sensor package having a wavelength-specific light filter, in accordance with various examples.
Figure 2B:
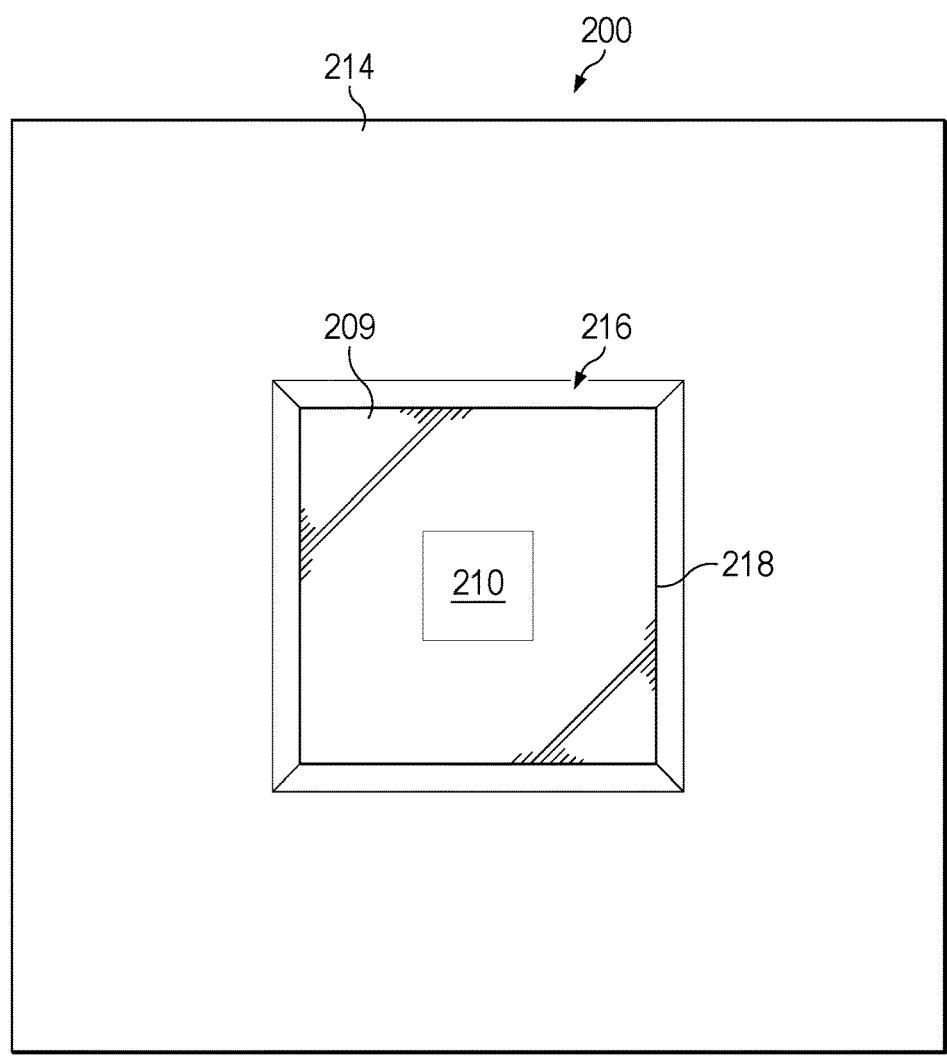
Figure 2C:
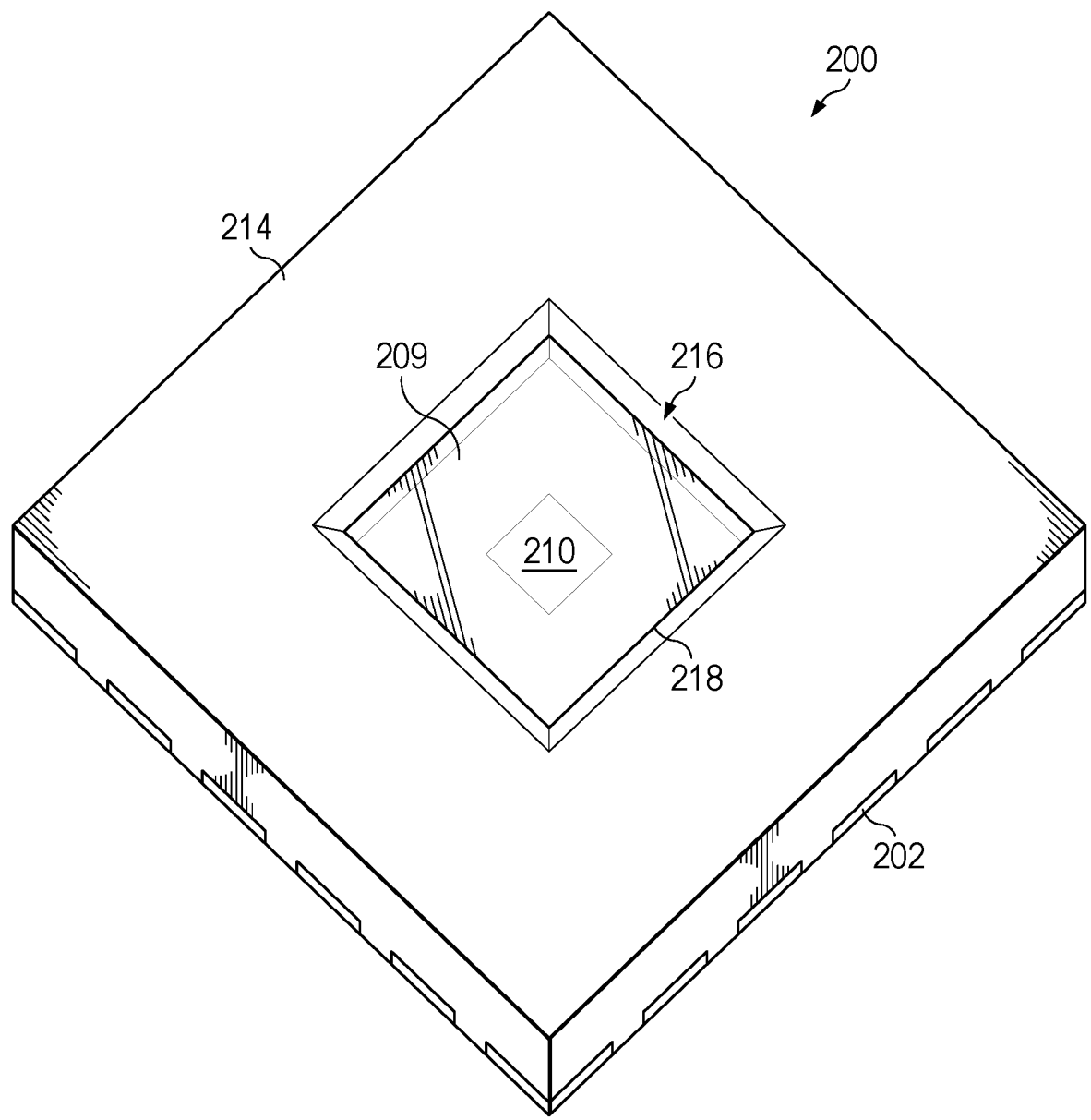

FIGS. 2A, 2B and 2C are profile cross-sectional, top-down, and perspective views, respectively, of a sensor package having a wavelength-specific light filter, in accordance with various examples. Specifically, FIG. 2A is a profile cross-sectional view of an example sensor package 200. The sensor package 200 may be a QFN package, although other package types are included in the scope of this description. The sensor package 200 includes multiple conductive terminals 202. The sensor package 200 includes a semiconductor die 204 having an active surface 206 on and/or in which various circuits and/or circuit components are formed. Conductive components 208 (e.g., solder balls) couple to the active surface 206 and to the conductive terminals 202. The semiconductor die 204 includes an inactive surface 209. The active surface 206 faces the conductive terminals 202, and the inactive surface 209 faces away from the conductive terminals 202. The inactive surface 209 includes a light sensor 210. The semiconductor die 204 includes a conductive via 212 that extends through the thickness (e.g., the body) of the semiconductor die 204 and that is coupled to the light sensor 210 and to the active surface 206 (e.g., to a processor, microcontroller, or other suitable circuitry on the active surface 206 that can route, receive, and/or process signals from the light sensor 210). An opaque mold compound 214 covers some or all of the conductive terminals 202, the semiconductor die 204, and the conductive components 208. A cavity 216 is formed in the mold compound 214. The properties of the cavity 216 may be similar to those of the cavity 114 described above, and thus they are not repeated here. A light filter 218 fills some or all of the cavity 216. The properties of the light filter 218 may be similar to those of the light filter 120 described above, and thus they are not repeated here. FIG. 2B is a top-down view of the sensor package 200, and FIG. 2C is a perspective view of the sensor package 200.

Figure 3A:
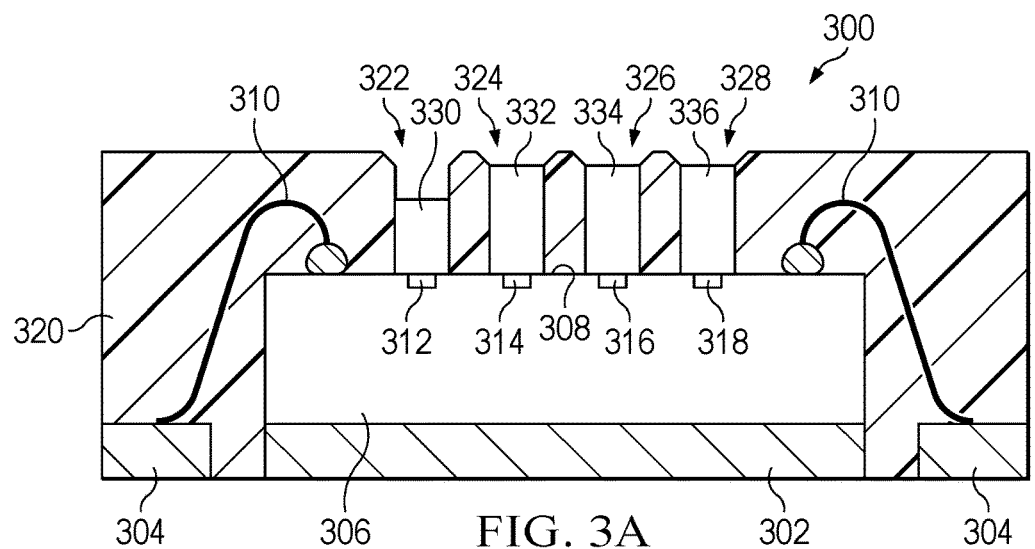
FIGS. 3A, 3B and 3C are profile cross-sectional, top-down, and perspective views, respectively, of a sensor package having a wavelength-specific light filter, in accordance with various examples.
Figure 3B:
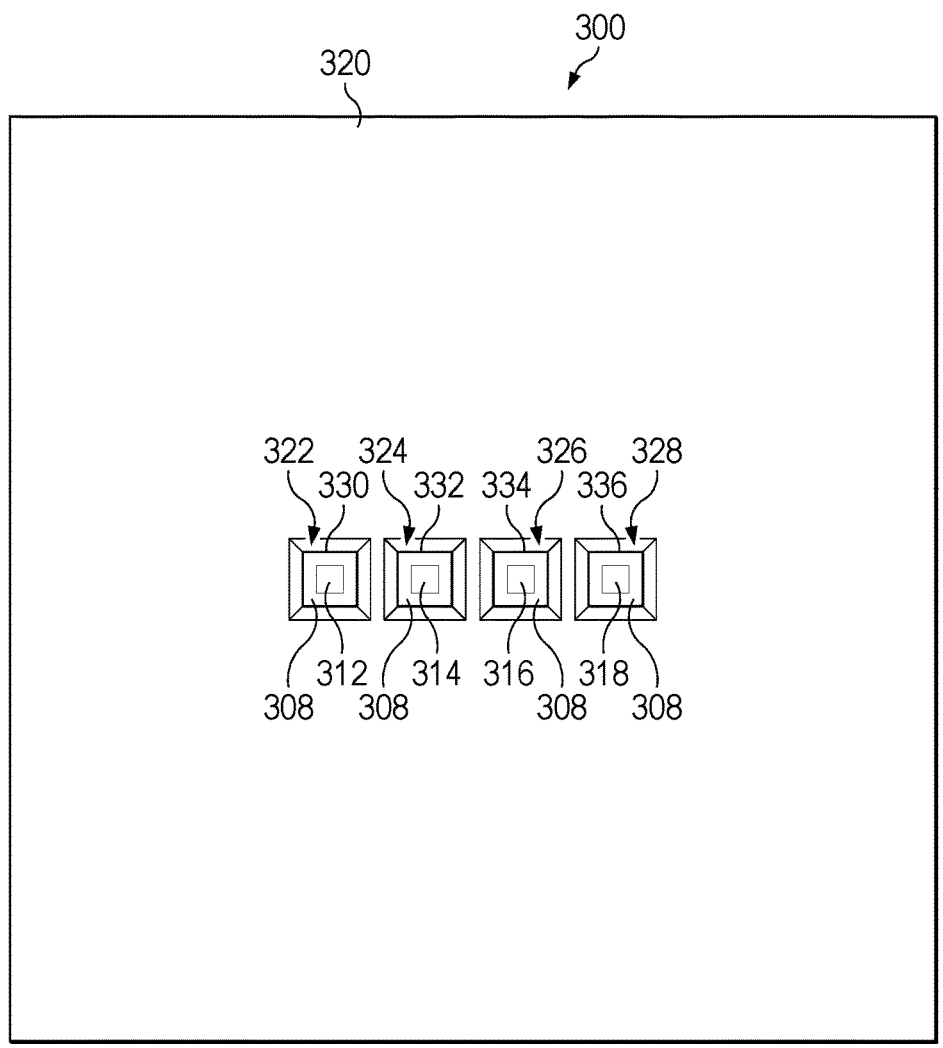
Figure 3C:
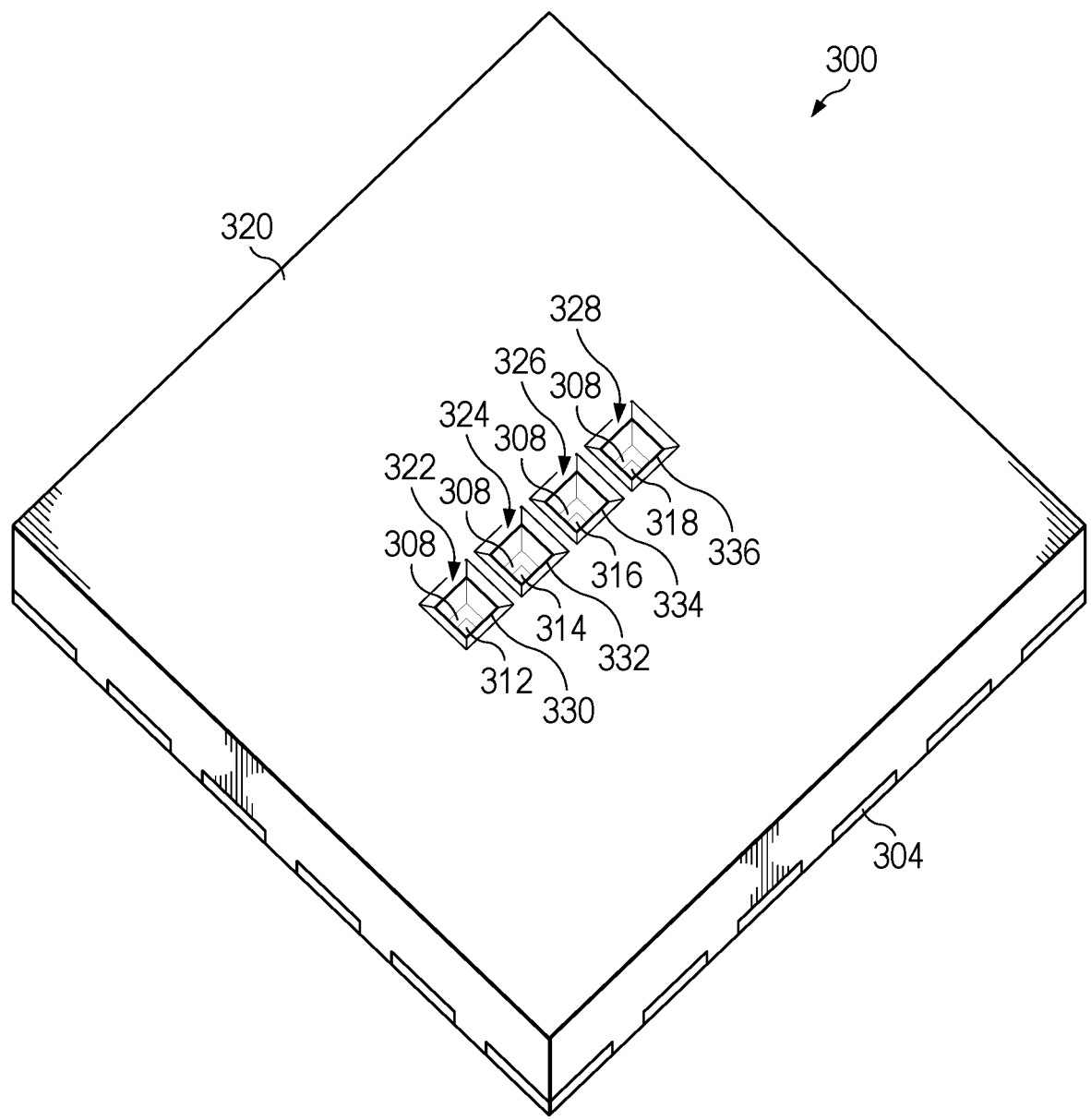

FIGS. 3A, 3B and 3C are profile cross-sectional, top-down, and perspective views, respectively, of a sensor package having a wavelength-specific light filter, in accordance with various examples. Specifically, FIG. 3A is a profile cross-sectional view of an example sensor package 300. The sensor package 300 may be a QFN package, a DIP, or any other suitable type of package. The sensor package 300 includes a die pad 302 and conductive terminals 304. The sensor package 300 includes a semiconductor die 306 coupled to the die pad 302 and having an active surface 308. The active surface 308 includes circuits and/or circuit components formed in and/or on the active surface 308. Bond wires 310 are coupled to the active surface 308 and to the conductive terminals 304. The active surface 308 includes multiple light sensors 312, 314, 316, and 318. In some examples, each of the light sensors 312, 314, 316, and 318 may be similar to the light sensors 110, 210 described above. An opaque mold compound 320 covers some or all of the die pad 302, the conductive terminals 304, the semiconductor die 306, and the bond wires 310. The mold compound 320 includes cavities 322, 324, 326, and 328. Each of the light sensors 312, 314, 316, and 318 is exposed to a different one of the cavities 322, 324, 326, and 328, respectively. Each of the light sensors 312, 314, 316, and 318 is partially or fully filled with a different light filter 330, 332, 334, and 336, respectively.

Each of the light filters 330, 332, 334, and 336 has a different material composition and/or thickness that affects the wavelengths of light that are filtered. Specifically, each of the light filters 330, 332, 334, and 336 includes a different combination of silicone, epoxy base with metal particles, and organic dye and/or has a different thickness, such that each of the light filters 330, 332, 334, and 336 rejects light having a different target wavelength range (such different ranges may overlap with each other). For example, the material composition and/or thickness of the light filter 330 may be set so the light filter 330 is configured to reject all light (including visible and invisible light, such as infrared light) except red light. For example, the material composition and/or thickness of the light filter 332 may be set so the light filter 332 is configured to reject all light (including visible and invisible light, such as infrared light) except green light. For example, the material composition and/or thickness of the light filter 334 may be set so the light filter 334 is configured to reject all light (including visible and invisible light, such as infrared light) except blue light. For example, the material composition and/or thickness of the light filter 336 may be set so the light filter 336 is configured to reject all light (including visible and invisible light, such as infrared light) except indigo light. By permitting only light with differing wavelengths to enter into each of the cavities 322, 324, 326, and 328 and to reach the corresponding light sensors 312, 314, 316, and 318, the information obtained by each of the light sensors 312, 314, 316, and 318 is more color-specific. This increased granularity in color-specific information may enable an electronic device containing the sensor package 300 to perform operations that it would otherwise be unable to perform.

In examples, the thickness of each of the light filters 330, 332, 334, and 336 is at least 0.5 millimeters, as described above with reference to the light filters 120, 218. The cavities 322, 324, 326, and 328 have properties similar to the properties of the cavity 114 as described above, and thus these properties are not described again here. Each of the light filters 330, 332, 334, and 336 may have physical properties similar to the properties of the light filter 120 as described above, and thus such properties are not described again here, with the exception that the specific material compositions of the light filters 330, 332, 334, and 336 may vary so different wavelengths of light are rejected. FIG. 3B is a top-down view of the sensor package 300, and FIG. 3C is a perspective view of the sensor package 300.

Figure 4A:
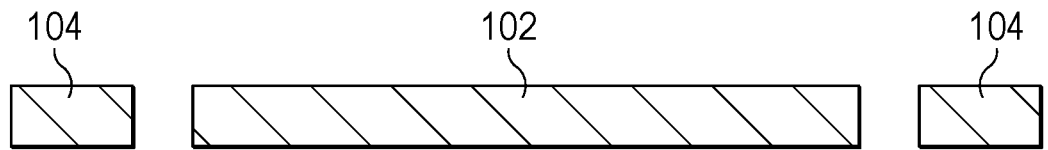
FIGS. 4A-4F are a process flow for manufacturing a sensor package having a wavelength-specific light filter, in accordance with various examples.
Figure 4B:
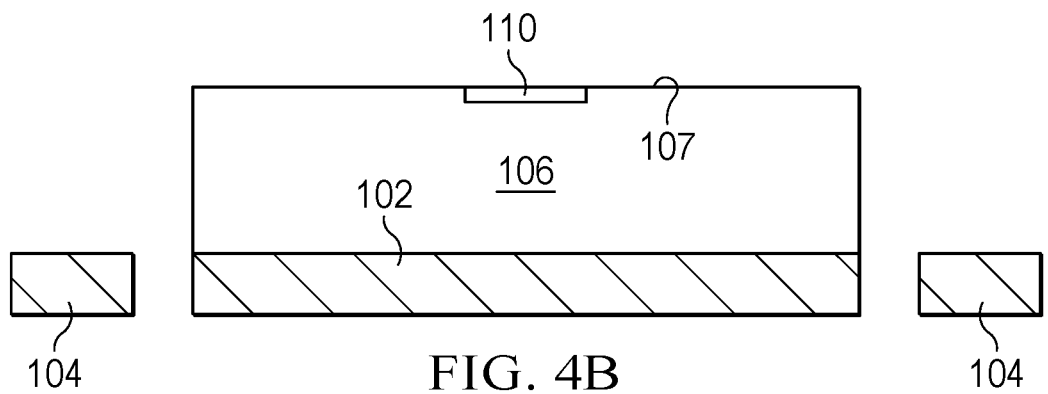
Figure 4C:
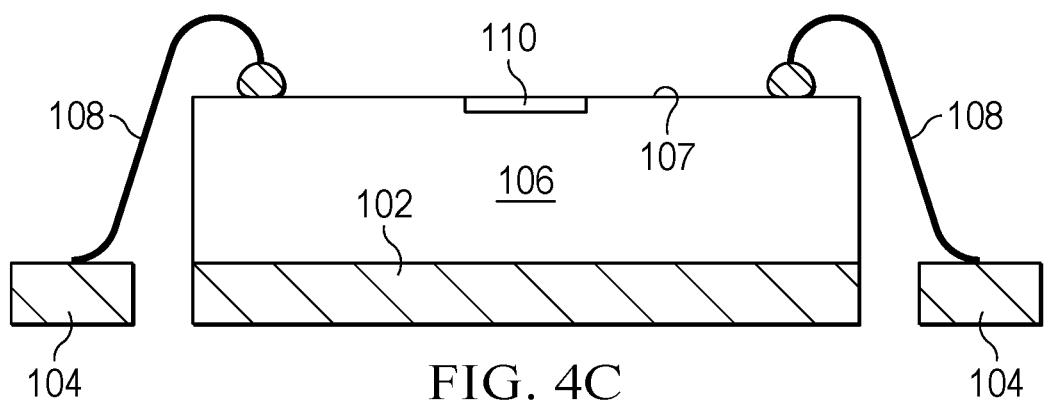
Figure 4D:
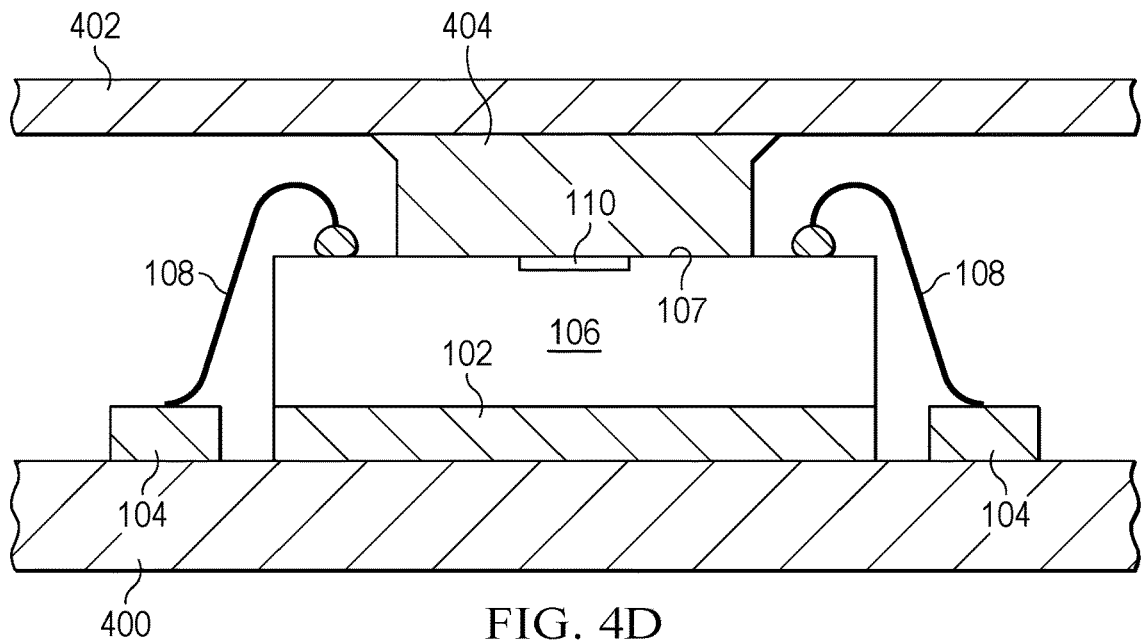
Figure 4E:
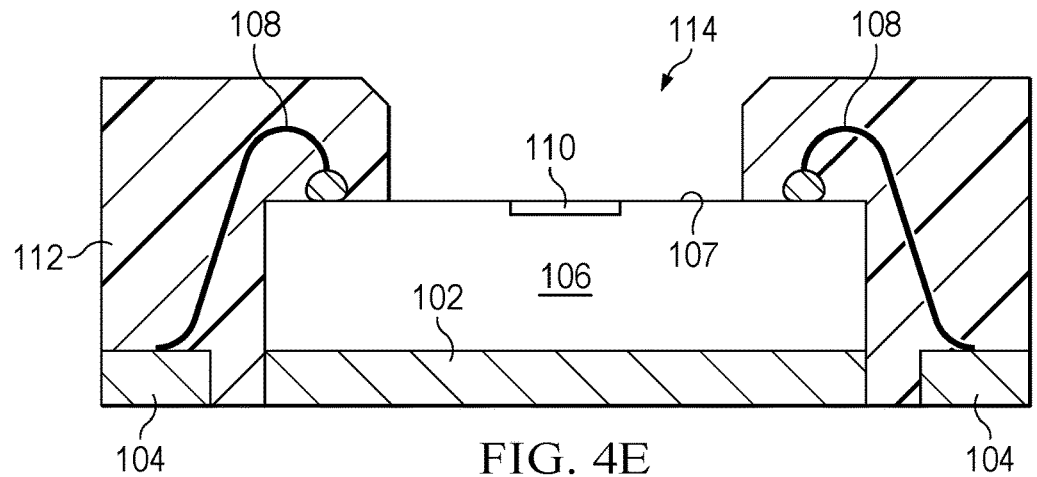
Figure 4F:
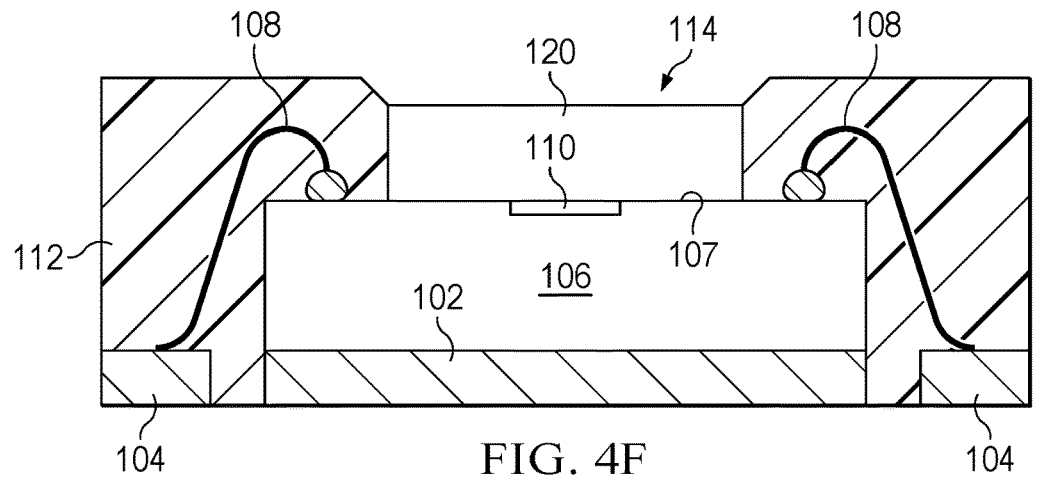
Figure 5:
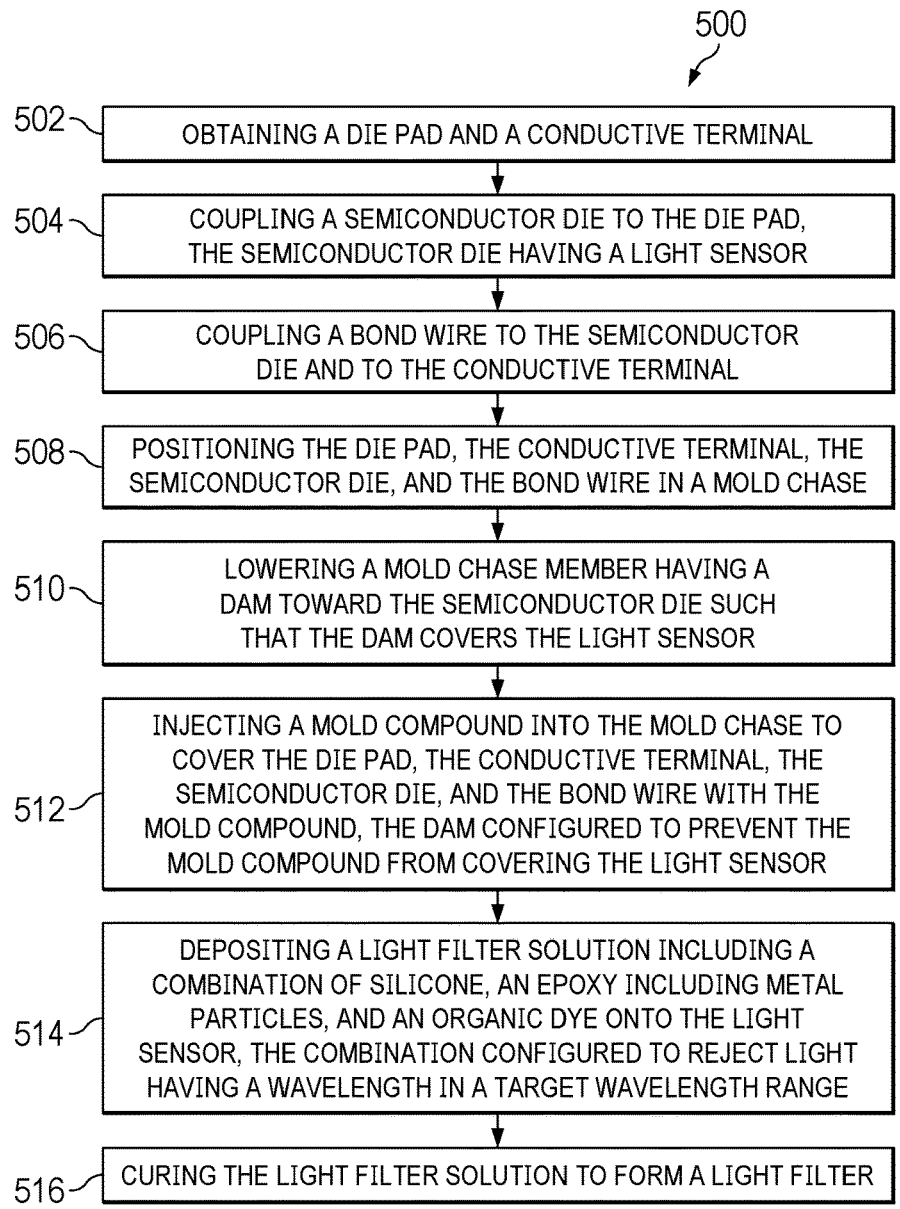
FIG. 5 is a flow diagram of a method for manufacturing a sensor package having a wavelength-specific light filter, in accordance with various examples.

FIGS. 4A-4F are a process flow for manufacturing a sensor package having a wavelength-specific light filter, in accordance with various examples. The process flow is presented in the context of the example sensor package 100 described above, but the process flow may be adapted to manufacture any sensor package described herein, as well as variations of the sensor packages described herein. FIG. 5 is a flow diagram of a method 500 for manufacturing a sensor package having a wavelength-specific light filter, in accordance with various examples. The method 500 is now described in parallel with the process flow of FIGS. 4A-4F. The method 500 includes obtaining a die pad and a conductive terminal (502). FIG. 4A is a profile cross-sectional view of the die pad 102 and multiple conductive terminals 104. The method 500 includes coupling a semiconductor die to the die pad, the semiconductor die having a light sensor (504). FIG. 4B is a profile cross-sectional view of the semiconductor die 106 having a light sensor 110 and coupled to the die pad 102. For example, a die attach layer (not expressly shown) is useful to couple the semiconductor die 106 to the die pad 102. The method 500 includes coupling a bond wire to the semiconductor die and to the conductive terminal (506). FIG. 4C is a profile cross-sectional view of the bond wires 108 coupled to the conductive terminals 104 and to the semiconductor die 106.

The method 500 includes positioning the die pad, the conductive terminal, the semiconductor die, and the bond wire in a mold chase (508). The method 500 also includes lowering a mold chase member having a dam toward the semiconductor die such that the dam covers the light sensor (510). FIG. 4D is a profile cross-sectional view of the structure of FIG. 4C positioned inside a mold chase having a mold chase bottom member 400 and a mold chase top member 402. The mold chase top member 402 includes a dam 404, which, responsive to the mold chase being closed, extends to and contacts the light sensor 110 at the active surface 107 of the semiconductor die 106.

The method 500 includes injecting a mold compound into the mold chase to cover the die pad, the conductive terminal, the semiconductor die, and the bond wire(s) with the mold compound (512). The dam is configured to prevent the mold compound from covering the light sensor (512). FIG. 4E is a profile cross-sectional view of a mold compound 112 covering some or all of the die pad 102, the conductive terminals 104, the semiconductor die 106, and the bond wires 108. The dam 404 prevented mold compound 112 from flowing over and covering the light sensor 110 and areas of the active surface 107 circumscribing the light sensor 110. Consequently, the cavity 114 is formed. Cavity 114 has dimensions commensurate with the dimensions of the dam 404. Thus, the dimensions of the cavity 114 may be manipulated by adjusting the dimensions of the dam 404. The light sensor 110 is exposed to the cavity 114.

The method 500 includes depositing a light filter solution including a combination of silicone, an epoxy base including metal particles, and an organic dye onto the light sensor (514). The combination is configured to reject light having a wavelength in a target wavelength range (514). The method 500 also includes curing the light filter solution to form a light filter (516). FIG. 4F is a profile cross-sectional view of the structure of FIG. 4E with the light filter 120 having been deposited in liquid form (e.g., by syringe deposition) in the cavity 114 and cured. In examples, the liquid light filter solution may be cured by applying heat in the range of 150-200 degrees Celsius for a time period ranging from 30-60 minutes.

Figure 6:
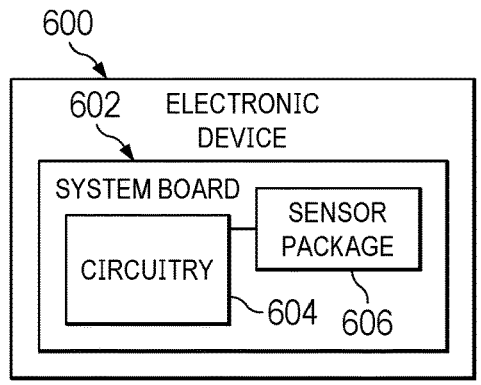
FIG. 6 is a block diagram of an electronic device including a sensor package having a wavelength-specific light filter, in accordance with various examples.

FIG. 6 is a block diagram of an electronic device 600 including a sensor package having a wavelength-specific light filter, in accordance with various examples. The electronic device 600 may be a smartphone, a tablet, a laptop computer, a desktop computer, a camera, a webcam, or any other suitable device that may have use for ambient light data. The electronic device 600 includes a system board 602. Circuitry 604 is mounted on the system board 602 and may include memory (e.g., including executable code), a processor, a microcontroller, a graphics processor, a sound card, connections (e.g., copper traces) between such components, etc. A sensor package 606 may be mounted on the system board 602 and coupled to the circuitry 604. The sensor package 606 is representative of the example sensor packages 100, 200, and 300 described herein.

In this description, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C, if intervening component C does not substantially alter the functional relationship between device A and device B, so device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitor, respectively, coupled in parallel between the same nodes. For example, a resistor or capacitor shown and described herein as a single component may instead be multiple resistors or capacitor, respectively, coupled in series between the same two nodes as the single resistor or capacitor. Unless otherwise stated, "about," "approximately," or "substantially" preceding a value means+/−10 percent of the stated value. Modifications are possible in the described examples, and other examples are possible within the scope of the claims.

What is claimed is:

1. An apparatus, comprising:
a semiconductor die having a first surface and opposing second and third surfaces on two sides of the first surface, the semiconductor die including
first and second light sensors on the first surface of the semiconductor die;
a mold compound covering at least parts of the second and third surfaces and at least a part of the first surface, the mold compound including first cavity and a second cavity, in which the first cavity over the first light sensor, the second cavity is over the second light sensor, and each of the first and second cavities has a rectangular shape in a plane parallel to the first surface;
a first light filter in the first cavity; and
a second light filter in the second cavity, the second light filter having a different optical property from the first light filter.

2. The apparatus of claim 1, wherein the first and second light filters are configured to reject light in different wavelength ranges.

3. The apparatus of claim 1, wherein at least one of the first light filter or the second light filter has a thickness of at least 0.5 millimeters.

4. The apparatus of claim 1, wherein at least one of the first light filter or the second light filter fills only a portion of the respective first or second cavities.

5. The apparatus of claim 1, wherein the first light filter includes at least one of a first silicone material, a first epoxy base material with first metal particles, or a first organic dye; and
wherein the second light filter includes at least one of a second silicone material, a second epoxy base material with second metal particles, or a second organic dye.

6. The apparatus of claim 1, wherein the mold compound is opaque.

7. The apparatus of claim 1, wherein at least one of the first or second light filters has properties including at least one of:
a viscosity ranging from 1.0 Pascal-seconds to 1.5 Pascal-seconds at 23 degrees Celsius prior to curing;
a hardness ranging between 80 and 90 on a type D Shore hardness scale;
a flexural strength ranging from 50 to 60 Mega Pascals;
a flexural modulus ranging from 1400 to 1500 Mega Pascals;
a glass transition temperature ranging from 160 to 180 degrees Celsius;
a volume resistivity ranging from 80 to 90 tera Ohm-meters; or
a moisture permeation ranging from 3.0 to 5.0 grams/m$^2$-days.

8. An apparatus, comprising:
a semiconductor die having a first surface and opposing second and third surfaces on two sides of the first surface;
first and second light sensors on the first surface of the semiconductor die;
a mold compound covering at least parts of the second and third surfaces and at least a part of the first surface, the mold compound having first and second cavities, the first cavity being over the first light sensor, and the second cavity being over the second light sensor;
a first light filter in the first cavity and having a first thickness; and
a second light filter in the second cavity and having a second thickness different from the first thickness.

9. The apparatus of claim 8, wherein the first light filter includes a first silicone material, a first epoxy base material with first metal particles, and a first organic dye; and
wherein the second light filter includes a second silicone material, a second epoxy base material with second metal particles, and a second organic dye.

10. The apparatus of claim 8, wherein the first light filter fills only a portion of the first cavity.

11. The apparatus of claim 8, wherein the first and second light filters have different optical properties.

12. The apparatus of claim 8, wherein the first and second light filters are configured to reject light of different wavelengths.

13. The apparatus of claim 8, wherein at least one of the first light filter or the second light filter has a thickness of at least 0.5 millimeters.

14. The apparatus of claim 8, wherein at least one of the first or second light filters has properties including at least one of:
a viscosity ranging from 1.0 Pascal-seconds to 1.5 Pascal-seconds at 23 degrees Celsius prior to curing;
a hardness ranging between 80 and 90 on a type D Shore hardness scale;
a flexural strength ranging from 50 to 60 Mega Pascals;
a flexural modulus ranging from 1400 to 1500 Mega Pascals;
a glass transition temperature ranging from 160 to 180 degrees Celsius;
a volume resistivity ranging from 80 to 90 tera Ohm-meters; or a moisture permeation ranging from 3.0 to 5.0 grams/m$^2$-days.

15. The apparatus of claim 8, further comprising conductive terminals and metal interconnects, wherein the semiconductor die is electrically coupled to the conductive terminals via the metal interconnects, and the molding compound covers at least parts of the conductive terminals, and the metal interconnects.

16. The apparatus of claim 15, wherein the metal interconnects include bond wires attached on the first surface of the semiconductor die.

17. The apparatus of claim 15, wherein the metal interconnects are coupled between a fourth surface of the semiconductor die opposing the first surface and the conductive terminals.

18. The apparatus of claim 15, wherein the conductive terminals and the metal interconnects are part of a quad flat no-lead (QFN) package, a dual in-line package (DIP), or a package with gullwing-style leads.

19. The apparatus of claim 8, wherein the semiconductor die, the first and second light filters, and the molding compound are part of a packaged integrated circuit or a sensor package.

20. The apparatus of claim 3, wherein at least one of the first or second light filter is configured to reject infra-red light.

21. The apparatus of claim 1, further comprising conductive terminals and metal interconnects, wherein the semiconductor die is electrically coupled to the conductive terminals via the metal interconnects, and the molding compound covers at least parts of the conductive terminals, and the metal interconnects.

22. The apparatus of claim 21, wherein the metal interconnects include bond wires attached on the first surface of the semiconductor die.

23. The apparatus of claim 21, wherein the metal interconnects are coupled between a fourth surface of the semiconductor die opposing the first surface and the conductive terminals.

24. The apparatus of claim 21, wherein the conductive terminals and the metal interconnects are part of a quad flat no-lead (QFN) package, a dual in-line package (DIP), or a package with gullwing-style leads.

25. The apparatus of claim 1, wherein the semiconductor die, the first and second light filters, and the molding compound are part of a packaged integrated circuit or a sensor package.

* * * * *